(12) United States Patent
Hooper

(10) Patent No.: US 6,270,574 B1
(45) Date of Patent: Aug. 7, 2001

(54) METHOD OF GROWING A BUFFER LAYER USING MOLECULAR BEAM EPITAXY

(75) Inventor: Stewart Edward Hooper, Oxon (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/554,534

(22) PCT Filed: Nov. 13, 1998

(86) PCT No.: PCT/JP98/05129

§ 371 Date: Jul. 14, 2000

§ 102(e) Date: Jul. 14, 2000

(87) PCT Pub. No.: WO99/25907

PCT Pub. Date: May 27, 1999

(30) Foreign Application Priority Data

Nov. 15, 1997 (GB) .................................................. 9724091

(51) Int. Cl.[7] .................................................. C30B 23/02
(52) U.S. Cl. .................. 117/105; 117/89; 117/94; 117/101; 117/106; 117/952
(58) Field of Search .................. 117/89, 94, 101, 117/105, 106, 952

(56) References Cited

U.S. PATENT DOCUMENTS

| | | | |
|---|---|---|---|
| 5,290,393 | 3/1994 | Nakamura | 156/613 |
| 5,385,862 | 1/1995 | Moustakas | 437/107 |
| 5,637,146 | 6/1997 | Chyi | 117/200 |
| 5,708,301 | * 1/1998 | Iyechika et al. | 257/744 |
| 5,760,426 | * 6/1998 | Marx et al. | 257/190 |
| 5,843,590 | * 12/1998 | Miura et al. | 428/698 |
| 5,930,656 | * 7/1999 | Furukawa et al. | 438/479 |
| 6,072,189 | * 6/2000 | Duggan | 257/14 |
| 6,096,130 | * 8/2000 | Kimura et al. | 117/89 |
| 6,130,147 | * 10/2000 | Major et al. | 438/604 |

FOREIGN PATENT DOCUMENTS

| | | |
|---|---|---|
| 59057997 | 4/1984 | (JP) . |
| 9731140 | 8/1997 | (WO) . |

OTHER PUBLICATIONS

N. Grandjean et al.; "GaN epitaxial growth on sapphire (0 0 0 1): the role of the substrate nitridation"; *Journal of Crystal Growth* 178 pp. 220–228; Nov. 12, 1996.

International Search Report, International Application No. PCT/JP98/05129, dated Mar. 22, 1999.

International Preliminary Examination Report, International Application No. PCT/JP98/05129, dated Feb. 12, 1999.

Z. Yang et al.; "High–quality GaN and AlN grown by gas–source molecular beam epitaxy using ammonia as the nitrogen source"; *J. Vac. Sci. Technol. B* 14(3); May/Jun. 1996; pp. 2354–2356.

* cited by examiner

*Primary Examiner*—Robert Kunemund
(74) *Attorney, Agent, or Firm*—Renner, Otto, Boisselle & Sklar, LLP

(57) ABSTRACT

A method of growing a Group III–V nitrite buffer layer on a substrate made of a different material by molecular beam epitaxy is provided, which compensates for lattice mismatching between a material of the substrate and a material of a further layer to be grown on the substrate. The method includes the steps of: placing the substrate in a vacuum chamber at a reduced pressure suitable for epitaxial growth and at an elevated temperature; and supplying species to the vacuum chamber to be used in the epitaxial growth including a nitrogen precursor species supplying nitrogen to the substrate to cause epitaxial growth on the substrate of the buffer layer. The elevated temperature is in the range of 300 to 800 ° C., and a supply rate of nitrogen to the substrate is such as to cause epitaxial growth on the substrate of the Group III–V nitride buffer layer of uniform thickness less than 2000 Å at a growth rate in the range of 2 to 10 μm/hr.

17 Claims, 3 Drawing Sheets

METHOD OF GROWING A BUFFER LAYER USING MOLECULAR BEAM EPITAXY

TECHNICAL FIELD

This invention relates to growth of a buffer layer on a substrate by molecular beam epitaxy (MBE) and is concerned more particularly, but not exclusively, with the growth of Group III–V nitride semiconductor materials, such as semiconductor heterostructures based on GaN.

BACKGROUND ART

The epitaxial growth of Group III–V nitride semiconductor materials on a substrate can be effected by molecular beam epitaxy (MBE) or by metal organic vapor phase epitaxy (MOVPE).

MOVPE takes place in a apparatus which is commonly at atmospheric pressure but sometimes at a slightly reduced pressure of typically 10 kPa. Ammonia and species providing one or more Group III–V elements to be used in epitaxial growth are supplied substantially parallel to the surface of the substrate upon which epitaxial growth is to take place, thus forming a boundary layer adjacent to, and flowing across, the substrate surface. It is in this gaseous boundary layer that decomposition to form nitrogen and the elements to be epitaxially deposited takes place so that the epitaxial growth is driven by gas phase equilibria.

MBE takes place in an apparatus in which the substrate is held within an ultra-high vacuum environment, typically about $10^{-3}$ Pa at a relatively low substrate temperature. The nitrogen precursor is supplied to the vacuum chamber fitted by means of a supply conduit and species providing one or more Group III–V elements are supplied from appropriate sources within heated effusion cells filed with controllable shutters. The nitrogen precursor and species supplied from the effusion cells travel across the vacuum chamber and reach the substrate where epitaxial growth takes place in a manner which is driven by the deposition kinetics.

In both MBE and MOVPE growth of gallium nitride (GaN) layers, the lack of a suitable substrate that is thermally matched and lattice-matched to GaN has necessitated the use of intermediate thin GaN or AlN buffer layers grown at low temperature on the substrate before growth of the GaN epilayer. Such a buffer layer is required to enable laying down of a GaN layer of sufficiently high quality for the fabrication of an optoelectronic device made from III–V nitrides, as disclosed in, for example, U.S. Pat. Nos. 5290393 and 5,385,862. The quality of the epilayer, and hence of the device itself, is highly sensitive to the nature of the buffer layer. However, difficulties can be encountered in the control of the growth of such buffer layers resulting in significant run-to-run variability of the layer.

In the case of the growth of a GaN buffer layer by MBE, the active nitrogen necessary for epitaxial growth may be generated either by a plasma source or by decomposition of ammonia ($NH_3$) at the substrate surface. Conventionally, growth of the buffer layer is effected at a temperature of around 250 to 450° C. which is less than the optimum temperature for GaN growth (which is 750 to 850° C.). It has been found necessary to use such low growth temperatures for the buffer layer in order to reduce the surface diffusion length of impinging atoms on the growth surfaces and thereby promote uniform and laminar nucleation of the buffer layer across the substrate surface.

In the case of a MBE growth method in which the active nitrogen is obtained by decomposition of ammonia at the growth surface, however, the decomposition rate of ammonia at the growth surface rapidly decreases at temperatures of less than 550° C., as shown by M. Kamp et al. in Proceeding of Topical Workshop on III–V Nitrides, Nagoya, Japan (1995). This makes the formation of such a buffer layer very difficult using such a source of nitrogen.

However, in the case of MBE using ammonia as the nitrogen precursor, the surface diffusion length of impinging atoms on the growth surface is dependent not only on the growth temperature but also on the arrival rate of nitrogen atoms at the growth surface. Generally, the surface diffusion length is inversely proportional to the square root of the atom flux or growth rate. In a method disclosed by Granjean et al. in Appl. Phys. Lett. 64, 2664 (1994), an increase in the length of time taken for lattice-mismatched InGaAs to nucleate in a laminar manner on a GaAs substrate using elevated growth rates, as opposed to the time taken using more moderate growth rates, has been demonstrated. In this method, a buffer layer of the same material as the substrate is grown at the optimum temperature for GaAs growth, that is about 580° C., prior to growth of the InGaAs layer in order to bury the substrate surface which may have some inhomogeneities. However, the provision of such a buffer layer may not be necessary if the substrate surface is of sufficient quality.

However, high growth rates of the order of $2\mu m/hr$ or more have not previously been obtainable for MBE growth of III–V nitrides. This has been due to restrictions on the amount of atomic nitrogen which can be supplied to the growth surface caused by inefficient plasma sources of nitrogen, low pumping speeds and large source-to-source distances. In the particular case of MBE growth using ammonia as a nitrogen precursor, it has been demonstrated by M. Kamp et al. in Proceedings of Topical Workshop on III–V Nitrides, Nagoya, Japan (1995) that the amount of active nitrogen generated by ammonia decomposition is dependent on the ammonia flux supplied only at substrate temperatures above 600° C. However, it has not proved possible to increase the ammonia flux sufficiently to achieve growth rates much greater than about 1.2 $\mu m/hr$.

DISCLOSURE OF THE INVENTION

It is an object of the invention to provide an improved method of growing a buffer layer of III–V nitrides using a MBE growth method.

According to the present invention, there is provided a method of growing a Group III–V nitride buffer layer on a substrate made of a different material by molecular beam epitaxy to compensate for lattice mismatching between the material of the substrate and the material of a further layer to be grown on the substrate. The method includes the steps of placing the substrate in a vacuum chamber at a reduced pressure suitable for epitaxial growth and at an elevated temperature in the range of 300 to 800° C., and supplying species to the vacuum chamber to be used in epitaxial growth including a nitrogen precursor species supplying nitrogen to the substrate at such a rate as to cause epitaxial growth on the substrate of a Group III–V nitride buffer layer of uniform thickness less than 2000 Å at a growth rate in the range of 2 to 10 $\mu m/hr$.

The substrate is typically made of sapphire, and, by growing such a buffer layer on the substrate at elevated temperatures, it is possible to effect growth of the buffer layer, which is of GaN for example, at a rate significantly higher than that conventionally used for growth of such buffer layers, whilst ensuring that the buffer layer is of the required uniform thickness less than about 2000Å and of sufficiently high crystal quality for the fabricator of the required epilayer or optoelectronic device to take place on top of the buffer layer. Previously, it has only been possible to form such buffer layers at low temperatures and at a low growth rate to produce the required uniform and laminar nucleation of the buffer layer across the substrate. Such a method renders the use of MBE growth in reference to MOVPE growth much more attractive. MBE has the advantages over MOVPE that it ensures less wastage of nitrides, more controllable and uniform growth, and growth at lower temperatures under certain circumstances.

The invention is particularly applicable to the growth of III–V nitride buffer layers necessary to enable high quality epilayers and optoelectronic devices, such as lasers and light-emitting diodes, to be growth.

Furthermore, the invention is particularly applicable to MBE growth of buffer layers using ammonia as the nitrogen precursor species. In this case, growth of the buffer layer at an elevated temperature can be used to allow highly effective decomposition of ammonia at the growth surface. This contrasts with the poor decomposition rate of ammonia at temperatures conventionally used for formation of buffer layers which has previously made the formation of such buffer layers using this nitrogen precursor difficult and time-consuming.

The species supplied to the vacuum chamber preferably includes species containing at least one Group III element, for example containing at least one of gallium, aluminium and indium.

Preferably, the growth temperature is in the range of 500 to 700° C., and most preferably in the range of 600 to 700° C., whereas the growth rate is preferably in the range of 3 to 6 $\mu$m/hr, and most preferably in the range of 4 to 5 $\mu$m/hr.

Preferably, the buffer layer is grown to a thickness of less than about 500 Å, and most preferably to a thickness of about 200 Å.

In a development of the invention, the growth of the buffer layer is followed by growth of a further layer at substantially the same temperature but at a growth rate of less than 2 $\mu$m/hr. The further layer may be an epilayer of a thickness in the range of 0.5 to 10 $\mu$m, and the epilayer may be formed from the same elements as the buffer layer. The elements may be gallium and nitrogen, for example.

BRIEF DESCRIPTION OF THE DRAWINGS

In order that the invention may be more fully understood, reference will now be made, by way of example, with reference to the accompanying drawings, in which.

BEST MODE FOR CARRYING OUT THE INVENTION

Figure 1:
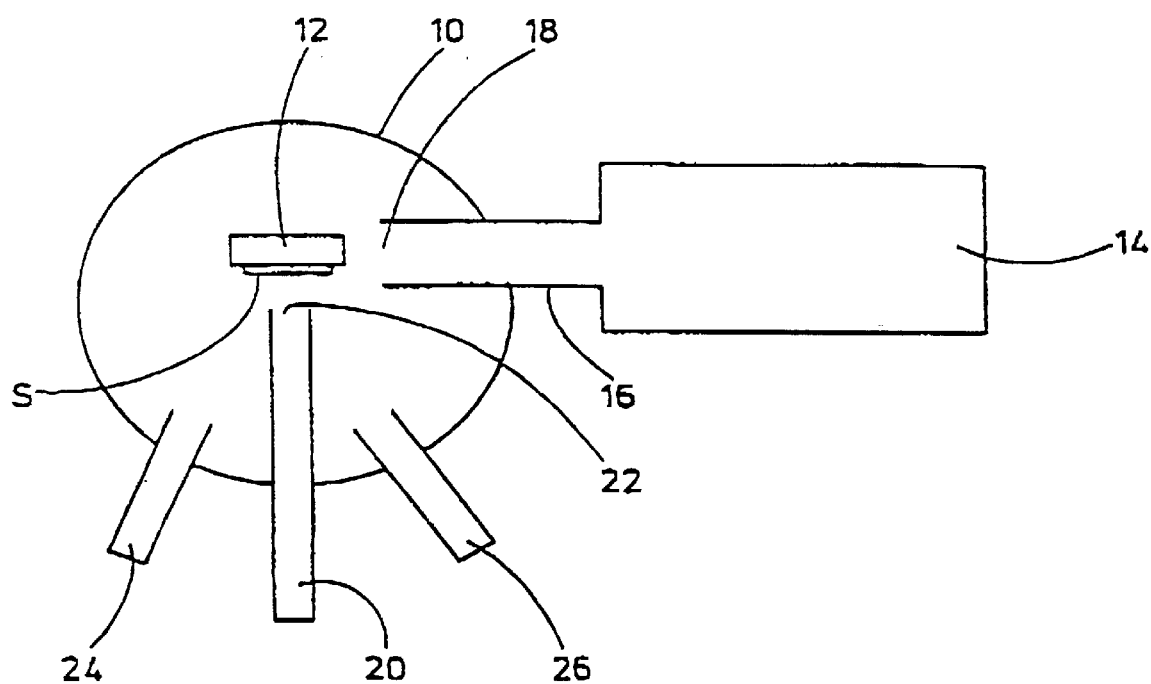
FIG. 1 is a schematic diagram of apparatus for carrying out a MBE growth method in accordance with the invention.

FIG. 1 shows apparatus for the epitaxial deposition of GaN-type semiconductor material by molecular beam epitax (MBE). The apparatus includes a vacuum chamber 10 in which is disposed a heated support 12 arranged to support and heat a substrate S. The vacuum chamber 10 is connected to an ultra-high vacuum pump 14 by way of an exhaust conduit 16 which extends into the vacuum chamber 10. The inner end of the exhaust conduit 16 defines a vacuum outlet 18 of the vacuum chamber 10 adjacent to the support 12. The vacuum chamber 10 is also provided with first supply conduit 20 which extends into the vacuum chamber so that the outlet 22 of the first supply conduit 20 is adjacent to and faces the surface of the substrate S upon which epitaxial growth is to take place. The first supply conduit 20 is used to supply ammonia as the precursor of the nitrogen required in the epitaxial growth process. Because of the positioning of the outlet 22 relatively close to the substrate S, a relatively high ammonia vapor pressure is localized at the growth surface whilst enabling an ultra-high vacuum environment within the vacuum chamber 10 to be achieved by the pump 14.

The apparatus further comprises a pair of independently operable shutter-controlled effusion cells 24 and 26 which contain sources of gallium and optionally another species (such as aluminum or a dopant) which may be required in the epitaxial growth process. The effusion cells 24 and 26 define further supply conduits extending into the vacuum chamber 10 by only a relatively small amount.

In operation of such apparatus to carry out a method in accordance with the invention, the substrate S, which may be made of sapphire for example, is heated to an elevated temperature, for example in the region of 600 to 700° C. by means of the heated support 12, and the vacuum chamber 10 is evacuated to a pressure of about $10^{-3}$ Pa (although the pressure may differ from this value provided that it is in the range of from $10^{-2}$ to $10^{-9}$ Pa). Ammonia gas is caused to flow through the first supply conduit 20 into the vacuum chamber 10 at a flow rate of about 10 sccm (although the flow rate may be varied between 2 to 15 sccm) which is higher than the rate which would normally be used for the ammonia flow in molecular beam epitaxial growth. The pump 14 is operated at a pumping speed of about 5,000 s$^{-1}$ (although the speed may be varied between 2,000 and 6,000 s$^{-1}$) which is several times the speed typically used for molecular beam empitaxy so as to permit a higher flow of ammonia than usual whilst maintaining the ultra-high vacuum in the chamber 10. This, together with the location of the outlet 22 of the first supply conduit 20 relatively near to the substrate S, ensures a significant increase in the effective ammonia flux localized at the growth surface as compared to conventional molecular beam epitaxy.

The distance between the outlet 22 of the first supply conduit 20 and the growth surface of the substrate S can be adjusted in real time during the epitxial growth process in such a way as to allow optimisation of ammonia flux uniformity across the substrate X and to prevent possible overheating of the inner end of the first supply conduit 20.

Gallium is controllably supplied in a manner known per se from the effusion cell 24, which is held at an elevated temperature of a about 1000 to 1100° C., on opening of the associated shutter to enable epitaxial growth of GaN on the substrate S. Provided that the atomic nitrogen flux is sufficient, the growth rate is dependent on the gallium flux supply rate which is of the order of 6×10$^{15}$ atoms cm$^{-2}$ s$^{-1}$ for a preferred growth rate of 5 $\mu$m/hr. The preferred substrate temperature for this growth rate is about 650 to 700° C. The cell 26 can be used to supply aluminum or indium or a dopant for incorporation into the epitaxial growth material as necessary in a manner which is known per se.

In an alternative embodiment, instead of providing an ammonia flux through the first supply conduit 20 as the source of nitrogen, any other suitable form of nitrogen precursor may be employed, for example hydrazine of a plasma source.

The ammonia or other gaseous nitrogen precursor is supplied as a concentrated stream across the growth surface of the substrate S so that the ammonia is decomposed at the growth surface by surface cracking to form nitrogen. Assuming approximately 100% cracking efficiency at the substrate surface, the required atomic nitrogen flux is obtainable from a known ammonia injector cell at a temperature of about 200° C. The elevated temperature of the substrate S allows highly efficient decomposition of ammonia at the growth surface so as to ensure a low surface diffusion length of impinging atoms on the growth surface and thus promoting uniform and laminar nucleation of GaN to provide the required thin, uniform GaN buffer layer of good crystal quality at a growth rate which is significantly higher (2 to 0.75 $\mu$m/hr).

Figure 2:
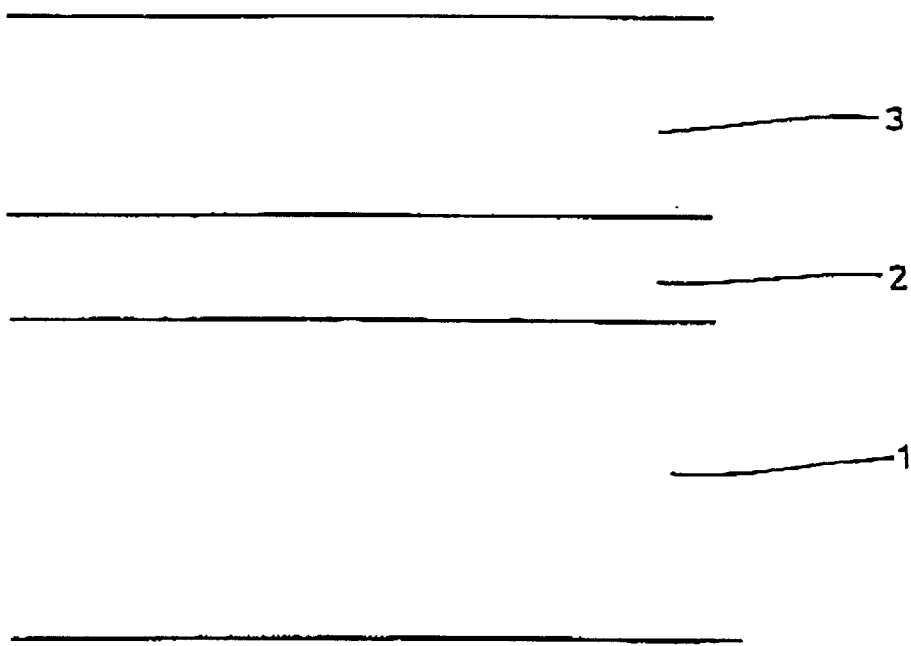
FIG. 2 is a diagram showing the location of a buffer layer in a III–V nitrite structure.

As shown in the diagram of FIG. 2, the GaN buffer layer 2 formed on the sapphire substrate 1 is provided to compensate for lattice-mismatching between the sapphire material of the substrate 1 and the material of the epilayer or optoelectronic deivce 3. The buffer layer 2 must be of sufficiently high quality to enable the epilayer or optoelectronic device 3 to be subsequently fabricated on the buffer layer 2, and the quality of the resulting epilayer of device 3 is highly sensitive to the nature of the buffer layer 2.

Figure 3:
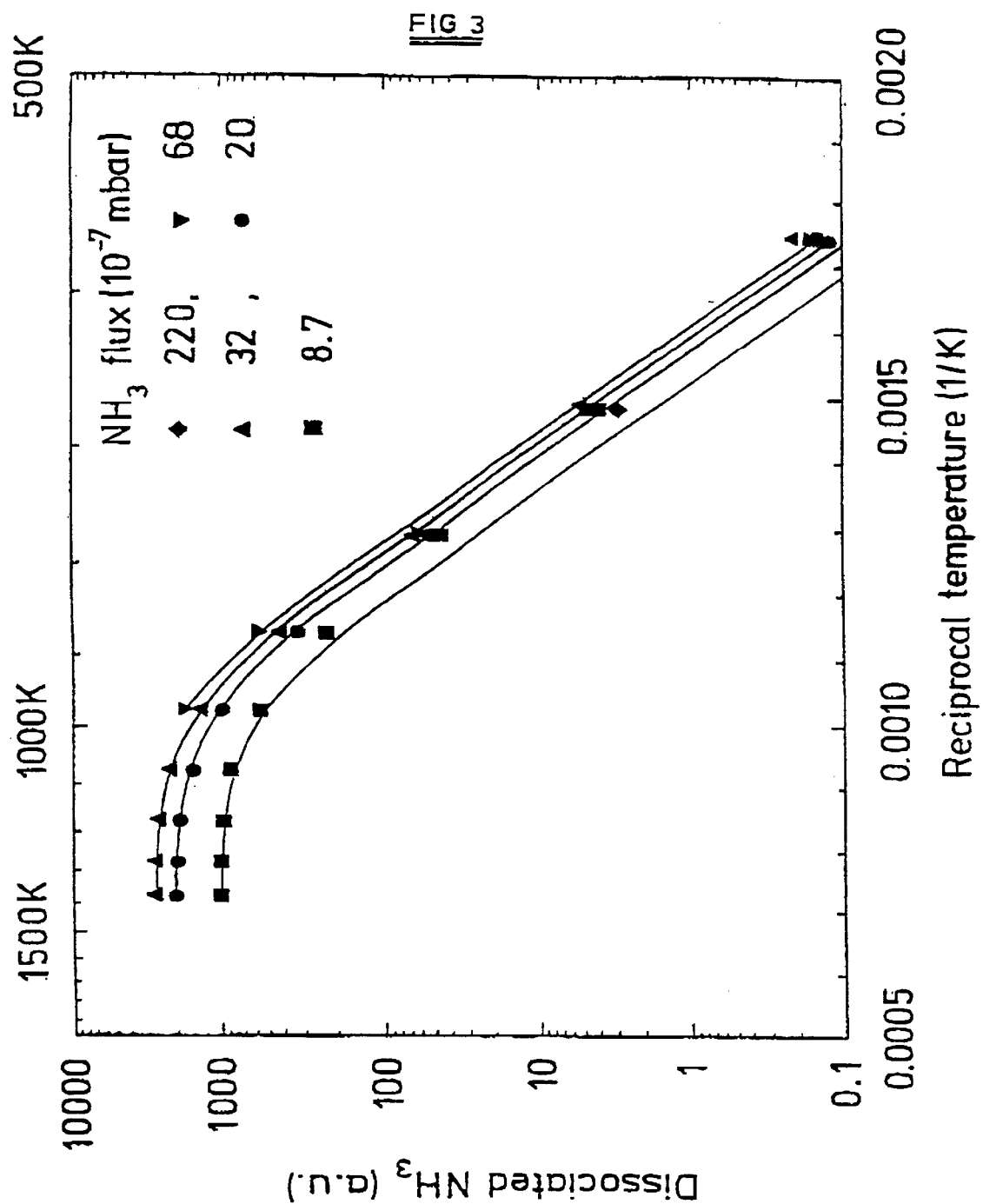
FIG. 3 is an Arrhenius plot of the temperature and flux dependence of ammonia dissociation.

FIG. 3 shows the temperature and flux dependence of ammonia dissociation, the different curves showing the area of dissociation (on a logarithmic scale) as a function of the substrate temperature (expressed as a reciprocal) for different ammonia flux levels, namely $8.7 \times 10^{-7}$, $20 \times 10^{-7}$, $32 \times 10^{-7}$, $68 \times 10^{-7}$ and $220 \times 10^{-7}$ mbar. Only at a substrate temperature above about 600° C. is the amount of active nitrogen generated by ammonia decomposition dependent on the ammonia flux supplied. Thus, by heating the substrate to a temperature above this level, and by supplying ammonia to the growth surface at a suitable rate, it is possible to ensure a load surface diffusion length of impinging atoms on the growth surface in order to provide a buffer layer of appropriate quality.

Figure 4:
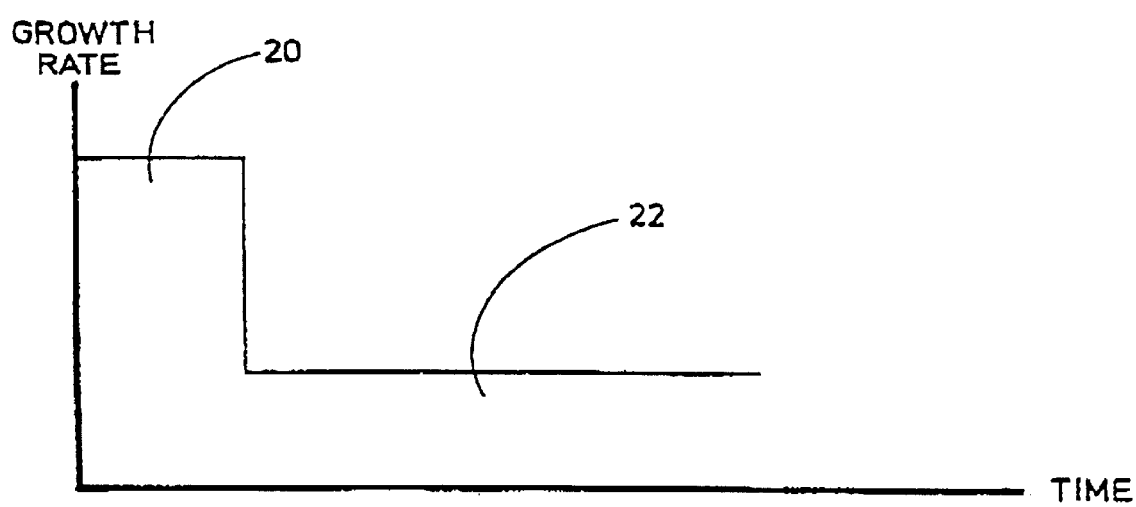
FIG. 4 is a plot showing the growth rate profile of a III–V nitrite buffer layer and epilayer or device grown at the same temperature.

In a development of the invention, it is possible to grow both a thin buffer layer 20 and a corresponding epilayer 22 (or optoelectronic device) at the same temperature by controlling the growth rate, as shown by the plot of growth rate against time in FIG. 4. An initially high growth rate is used as described above to produce the buffer layer 20 at the elevated substrate temperature of 600 to 700° C., and the growth rate is then reduced to a conventional value (0.2 to 0.75 $\mu$m/hr) by decreasing the amount flux so as to form the subsequent epilayer over a longer period of time. The buffer layer typically has a thickness of about 250Å whereas the epilayer typically has a thickness of about 5 $\mu$m.

Where ammonia dissociation at the growth surface is used to provide atomic nitrogen as in the example described above, the difficulty of achieving a high growth rate can be overcome by utilizing one or more of the following: (i) high pumping speed in the growth chamber, (ii) a pumping port located close to the substrate, (iii) a small source-to-substrate distance, and (iv) enhancement of ammonia decomposition at the growth surface by the application of ultra violet radiation.

In the alternative of the use of a plasma source to generate the atomic nitrogen, the difficulty of achieving a high growth rate can be overcome by one or more of the following: (i) use of more than one plasma source, (ii) a high pumping speed in the growth chamber, and (iii) a small source-to-substrate distance.

INDUSTRIAL APPLICABILITY

In accordance with the above-described invention, the improved method of growing a buffer layer of III–V nitrides using MBE technique is provided. Such a method enables high quality epilayers and optoelectronic devices, such as lasers and light-emitting diodes, to be grown by MBE.

What is claimed is:

1. A method of growing a Group III–V nitride buffer layer on a substrate made of a different material by molecular beam epitaxy to compensate for lattice mismatching between a material of the substrate and a material of a further layer to be grown on the substrate, the method comprising of the steps of:

placing the substrate in a vacuum chamber in the pressure range of from $10^{-2}$ to $10^{-9}$ Pa and at an elevated temperature; and supplying species to the vacuum chamber to be used in the epitaxial growth including a nitrogen precursor species supplying nitrogen to the substrate to cause epitaxial growth on the substrate of the buffer layer, wherein said elevated temperature is in the range of 300 to 800° C., and the flow rate of the nitrogen precursor is selected to be approximately from 2 to 15 sccm whereby a supply rate of nitrogen to the substrate is such as to cause epitaxial growth on the substrate Group III–V nitride buffer layer of uniform thickness less than 2000 Å at a growth rate in the range of 2 to 10 $\mu$m/hr.

2. A method according to claim 1, wherein the nitrogen precursor species is ammonia.

3. A method according to claim 1, wherein the species supplied to the vacuum chamber includes species containing at least one Group III element.

4. A method according to claim 1, wherein said at least one Group III element is at least one of gallium, aluminium and indium.

5. A method according to claim 1, wherein the growth temperature is in the range of 550 to 700° C.

6. A method according to claim 5, wherein the growth temperature is in the range of 600 to 700° C.

7. A method according to claim 1, wherein the growth rate is in the range of 3 to 6 $\mu$m/hr.

8. A method according to claim 7, wherein the growth rate is in the range of 4 to 5 $\mu$m/hr.

9. A method according to claim 1, further comprising the step of, after the growth of the buffer layer, growing a further layer at substantially the same temperature but at a growth rate of less than 2 $\mu$m/hr.

10. A method according to claim 9, wherein the further layer is an epilayer of a thickness in the range of 0.5 to 10 $\mu$m.

11. A method according to claim 10, wherein the epilayer is formed from the same elements as the buffer layer.

12. A method according to claim 11, wherein the elements are gallium and nitrogen.

13. A method according to claim 1, further comprising the step of, after the growth of the buffer layer, growing an optelectronic device.

14. A method according to claim 1, wherein the buffer layer is grown to a thickness of less than about 500 Å.

15. A method according to claim 14, wherein the buffer layer is grown to a thickness of about 200 Å.

16. A method according to claim 1, wherein the substrate is made of sapphire.

17. An electronic device incorporating a Group III–V nitride buffer layer grown by a method according to claim 1.

* * * * *